(12) United States Patent
Chen et al.

(10) Patent No.: US 10,886,914 B2
(45) Date of Patent: Jan. 5, 2021

(54) SEMICONDUCTOR SWITCH WITH MAGNETIC COUPLING DEVICE

(71) Applicant: ABB Schweiz AG, Baden (CH)

(72) Inventors: Nan Chen, Västerås (SE); Kalle Ilves, Västerås (SE); Muhammad Nawaz, Bro (SE)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 16/482,211

(22) PCT Filed: Feb. 15, 2017

(86) PCT No.: PCT/EP2017/053339
§ 371 (c)(1),
(2) Date: Jul. 30, 2019

(87) PCT Pub. No.: WO2018/149489
PCT Pub. Date: Aug. 23, 2018

(65) Prior Publication Data
US 2020/0228113 A1 Jul. 16, 2020

(51) Int. Cl.
*H03K 17/56* (2006.01)
*H02M 1/088* (2006.01)
(Continued)

(52) U.S. Cl.
CPC ............ *H03K 17/56* (2013.01); *H02M 1/088* (2013.01); *H02M 7/003* (2013.01); *H02M 7/493* (2013.01);
(Continued)

(58) Field of Classification Search
CPC ......... H03K 17/0814; H03K 17/08122; H03K 17/08146; H03K 17/12; H03K 17/122;
(Continued)

(56) References Cited

U.S. PATENT DOCUMENTS 3,699,358 A  10/1972 Wilkinson
4,201,957 A   5/1980 Cathell
(Continued)

FOREIGN PATENT DOCUMENTS

CN   103283140 A    9/2013
CN   106505514 A    3/2017
GB      155381 A   10/1979

OTHER PUBLICATIONS

International Search Report for International Application No. PCT/EP2017/053339, dated Nov. 3, 2017.
(Continued)

*Primary Examiner* — Diana J. Cheng
(74) *Attorney, Agent, or Firm* — Slater Matsil, LLP

(57) ABSTRACT

The present disclosure relates to a semiconductor switch leg S for a Power Electronic (PE) converter (1). The switch leg comprises a plurality of parallel connected semiconductor devices Sa-d. Each semiconductor device is connected with a positive conductor a-d+ connecting the semiconductor device to a positive terminal of an energy storing device (2) of the converter, and a negative conductor a-d-connecting the semiconductor device to a negative terminal of the energy storing device (2) of the converter, the semiconductor device together with the positive conductor and the negative conductor forming a current path across the energy storing device. The semiconductor switch leg comprises a plurality of magnetic coupling devices 3a-d, each magnetic coupling device being arranged between the two current paths of respective two neighbouring semiconductor devices of the plurality of semiconductor devices such that the current path of one of the two semiconductor devices and the current path of the other of the two semiconductor devices pass via the magnetic coupling device, and such that each current path
(Continued)

passes via two of said plurality of magnetic coupling devices.

20 Claims, 2 Drawing Sheets

(51) Int. Cl.
*H02M 7/00* (2006.01)
*H02M 7/493* (2007.01)
*H03K 17/0814* (2006.01)
*H03K 17/12* (2006.01)

(52) U.S. Cl.
CPC ..... *H03K 17/08146* (2013.01); *H03K 17/122* (2013.01)

(58) Field of Classification Search
CPC ...... H03K 17/56; H03K 17/567; H03K 17/58; H03K 17/60; H03K 17/602; H03K 17/62; H03K 17/6221; H03K 17/6257; H03K 17/6265; H03K 17/66; H03K 17/687; H03K 17/6871; H03K 17/6872; H03K 17/6874; H02M 1/088; H02M 1/096; H02M 7/003; H02M 7/42; H02M 7/44; H02M 7/48; H02M 7/493

See application file for complete search history.

(56) References Cited

U.S. PATENT DOCUMENTS

| 4,567,379 | A | | 1/1986 | Corey et al. |
| 5,010,470 | A | | 4/1991 | Lipman et al. |
| 5,515,002 | A | * | 5/1996 | Ideler ................ G01R 33/3852 |
| | | | | 330/146 |
| 6,985,371 | B2 | * | 1/2006 | Talja ...................... H01F 37/00 |
| | | | | 363/40 |
| 9,325,273 | B2 | * | 4/2016 | Zhang .................... H02P 27/06 |
| 2006/0131668 | A1 | | 6/2006 | Wagoner |
| 2012/0019267 | A1 | * | 1/2012 | Tabuchi ................ G01R 15/18 |
| | | | | 324/686 |
| 2013/0279211 | A1 | | 10/2013 | Green et al. |
| 2018/0138689 | A1 | | 5/2018 | Wu et al. |

OTHER PUBLICATIONS

Written Opinion of the International Searching Authority for International Application No. PCT/EP2017/053339, dated Nov. 3, 2017.

* cited by examiner

SEMICONDUCTOR SWITCH WITH MAGNETIC COUPLING DEVICE

TECHNICAL FIELD

The present disclosure relates to a semiconductor switch for a Power Electronic converter, the switch comprising a plurality of parallel connected semiconductor devices.

BACKGROUND

A power electronic (PE) converter, e.g. a Modular Multilevel Converter (MMC), may be used in many different power application such as Flexible Alternating Current Transmission Systems (FACTS) and High-Voltage Direct Current (HVDS). The power converter, e.g. each cell of an MMC, comprises semiconductor switches such as Insulated-Gate Bipolar Transistor (IGBT), Reverse Conducting IGBT (RC-IGBT), Bi-Mode Insulated Gate Transistor (BiGT), Integrated Gate-Commutated Thyristor (IGCT), Gate Turn-Off Thyristor (GTO) and Metal-Oxide-Semiconductor Field-Effect Transistor (MOSFET).

Lately, silicon carbide (SiC) has been begun being used as semiconductor material in the semiconductor switches, allowing a higher voltage and current (power) rating and operation at a higher temperature. This, however, results in additional challenges regarding short-circuit fault protection at the higher power rating. With the increased power rating (voltage×current) of the converter, and increased switching speed of SiC semiconductor switches, the fault/failure protection of a converter cell in MMC topology is a challenge.

A destructive and challenging case is so called 'shoot through' failure of a converter cell, which is primarily associated with semiconductor module failure and followed by incapable protection speed. A reason for this anomaly is linked to non-optimal converter module integration. Minimized parasitic components would also lead to very high di/dt in failure mode. Hence, it finally shortens device Safe Operating Area (SOA) and leaves protection circuit with a short time window. Moreover, in certain designs, due to high di/dt through parasitic coupling to the gate, it becomes impossible to turn off the device.

SUMMARY

It is an objective of the present invention to provide an improved semiconductor switch topology for PE converters for improved resistance to faults.

According to an aspect of the present invention, there is provided a semiconductor switch leg S for a Power Electronic (PE) converter. The switch leg comprises a plurality of parallel connected semiconductor devices. Each semiconductor device is connected with a positive conductor connecting the semiconductor device to a positive terminal of an energy storing device of the converter, and a negative conductor connecting the semiconductor device to a negative terminal of the energy storing device of the converter, the semiconductor device together with the positive conductor and the negative conductor forming a current path across the energy storing device. The semiconductor switch leg comprises a plurality of magnetic coupling devices, each magnetic coupling device being arranged between the two current paths of respective two neighbouring semiconductor devices of the plurality of semiconductor devices such that the current path of one of the two semiconductor devices and the current path of the other of the two semiconductor devices pass via the magnetic coupling device, and such that each current path passes via two of said plurality of magnetic coupling devices.

According to another aspect of the present invention, there is provided a PE converter comprising a plurality of an embodiment of the semiconductor switch leg of the present disclosure.

According to another aspect of the present invention, there is provided a method of protecting a semiconductor switch leg of a PE converter during short circuit. The switch leg comprises a plurality of parallel connected semiconductor devices. Each semiconductor device is connected with a positive conductor connecting the semiconductor device to a positive terminal of an energy storing device of the converter, and a negative conductor connecting the semiconductor device to a negative terminal of the energy storing device of the converter, the semiconductor device together with the positive conductor and the negative conductor forming a current path across the energy storing device. The semiconductor switch leg comprises a plurality of magnetic coupling devices, each magnetic coupling device being arranged between the two current paths of respective two neighbouring semiconductor devices of the plurality of semiconductor devices such that the current path of one of the two semiconductor devices and the current path of the other of the two semiconductor devices pass via the magnetic coupling device, and such that each current path passes via two of said plurality of magnetic coupling devices. The method comprises an inductance being generated in at least one of the magnetic coupling devices in response to a short circuit current being conducted through one of the current paths passing via said magnetic coupling device, the inductance supressing the short circuit current.

By means of the magnetic coupling device, e.g. magnetic choke or other inductor, and conductors from two different current paths of each two semiconductor devices in opposite directions passing there via/through, no (or a relatively low) inductance is generated in the magnetic coupling device at normal operation. However, in case of a short circuit, the much larger short circuit current passing via the magnetic coupling device, conducted by one of the conductors in the affected current path, results in a large inductance which suppresses the short circuit current and reduces the risk of damaging the semiconductor switch leg. For instance, depending on the positioning of the magnetic coupling devices in the current paths, the short circuit current of both the positive and the negative conductor of the short circuited semiconductor device is suppressed by the two different magnetic coupling devices via which they pass.

It is to be noted that any feature of any of the aspects may be applied to any other aspect, wherever appropriate. Likewise, any advantage of any of the aspects may apply to any of the other aspects. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc. for different features/components of the present disclosure are only intended to distinguish the features/components from other similar features/components and not to impart any order or hierarchy to the features/components.

BRIEF DESCRIPTION OF THE DRAWINGS

Embodiments will be described, by way of example, with reference to the accompanying drawings, in which.

DETAILED DESCRIPTION

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art. Like numbers refer to like elements throughout the description.

Figure 1:
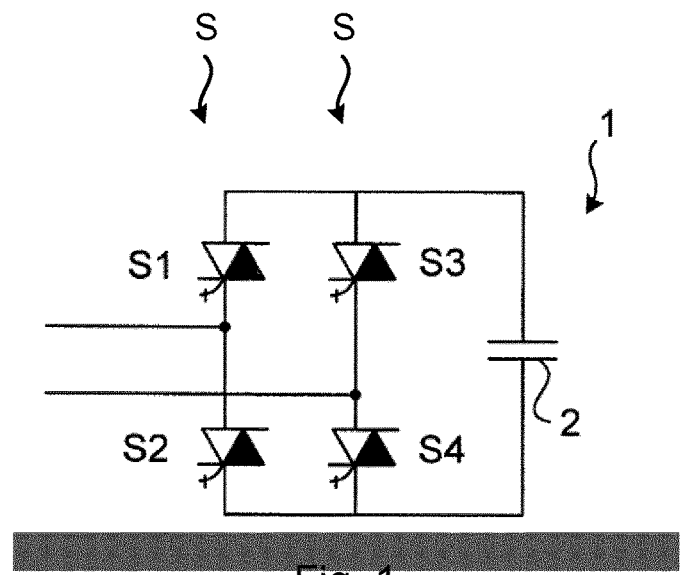
FIG. 1 is a schematic circuit diagram of an embodiment of a full-bridge converter cell, in accordance with the present invention.

FIG. 1 illustrates an example of a PE converter 1 which may in some embodiments be in the form of a Power Electronic Building Block (PEBB) or a converter module, comprising at least one semiconductor switch leg S. In the figure, the PE converter is a bipolar cell of an MMC, thus comprising two semiconductor switch legs S, whereas a unipolar cell would only comprise one semiconductor switch leg S. The cell comprises an energy storing device 2, here in the form of a capacitor. The energy storing device 2 may comprise a capacitor arrangement with any number of capacitors in series and/or parallel connection with each other. The energy storing device may e.g. comprise a ring-shaped capacitor such as a Power Ring Film Capacitor commercially available from SBE. The cell 1 also comprises four semiconductor switches S1-S4, forming the full-bridge (H-bridge) topology in the cell in which each leg S comprises two switches S1 and S2 or S3 and S4. Alternatively to the full-bridge configuration, the semiconductor switches may be in any other configuration, e.g. forming a half-bridge 3-level, or other types of converter topology. Similarly, a corresponding unipolar cell 1 comprises only two semiconductor switches S1-S2 in a single leg S, forming a half-bridge topology. Any number of semiconductor switches S1-S4, forming any number of legs S, may be used, and the cell with four switches shown in the figure is only an example. The present invention may be used with any type of converter comprising semiconductor switches, e.g. a 3-level converter, in addition to the full- and half-bridge MMC already mentioned. The semiconductor switches of the bipolar cell are conventionally named in the figure as S1 switch, S2 switch, S3 switch and S4 switch. When the switches S1 and S4 are closed and S2 and S3 are open, the cell is in a +1 state in which a positive voltage will be applied. By opening S1 and S4 switches and closing S2 and S3 switches, this voltage is reversed whereby the cell is in a −1 state and a negative voltage will be applied. Zero voltage (cell bypass), the cell being in a 0 state, may be obtained in two different ways, by closing the upper switches S1 and S3 (lower switches S2 and S4 being open) or by closing lower switches S2 and S4 (upper switches S1 and S3 being open).

Figure 2A:
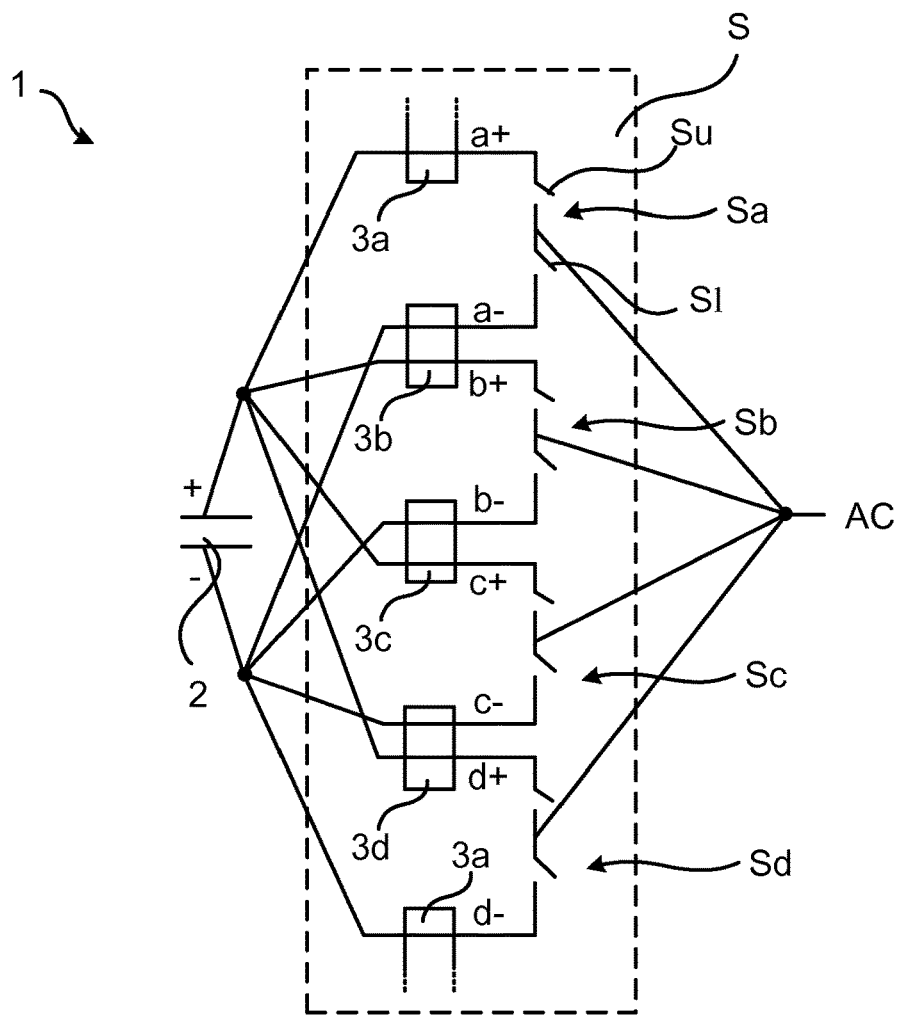
FIG. 2a is a schematic circuit diagram of an embodiment of a semiconductor switch leg comprising a plurality of semiconductor devices connected in parallel, in accordance with the present invention.

FIG. 2a illustrates an embodiment of a semiconductor switch leg S connected to an energy storing device 2 in a converter 1. The semiconductor switch leg S comprises a plurality of parallel connected semiconductor devices Sa, Sb, Sc and Sd, each comprising any number of at least one switch, e.g. an upper switch Su and a lower switch S1, and being connected across the energy storing device 2 by means of a positive conductor a+, b+, c+ and d+, respectively, connected to a positive terminal of the energy storing device, and negative conductor a−, b−, c− and d−, respectively, connected to a negative terminal of the energy storing device. In other embodiments, each semiconductor device Sa, Sb, Sc and Sd may comprise any switch topology, such as only one switch or a half-bridge, full-bridge or three-level topology. The positive and negative conductors may be called Direct Current (DC) link busbars. On the other side, the semiconductor devices are each connected to an Alternating Current (AC) busbar. Between each two neighbouring semiconductor devices Sa and Sb, Sb and Sc, Sc and Sd, and Sd and Sa, forming a daisy chain loop, a magnetic coupling device, herein exemplified as a choke (which is preferred in some embodiments) 3a, 3b, 3c and 3d, respectively, is positioned. It should be noted that in the figure, the loop has been flattened to be more easily illustrated and that the magnetic choke 3a is positioned between semiconductor devices Sa and Sd, neighbouring each other. The use of four parallel semiconductor devices Sa-d is only an example and in other embodiments any number of at least two semiconductor devices may be used in each semiconductor switch leg S. Typically, the same number of semiconductor devices may be used in each semiconductor switch leg S of the converter 1.

Each magnetic choke 3a-d is arranged in the semiconductor switch leg S such that the positive conductor a-d+ of one of the neighbouring semiconductor devices, between which the magnetic choke is arranged, and the negative conductor a-d− of the other one of the neighbouring semiconductor devices passes through the magnetic choke. Thus, the oppositely directed currents in the conductors passing through the choke generate induction in the choke which typically substantially cancel each other out during regular operation of the semiconductor switch leg, e.g. to an inductance of less than 500 nH, e.g. less than 250 nH such as within the range of 30-200 nH. However, during short circuit condition, the higher short circuit current conducted through the conductors of a short circuited semiconductor device will generate substantial induction, e.g. at least 1 μH, in the two chokes through which the respective conductors pass, supressing the short circuit current. For instance, if the semiconductor device Sb is short circuited, a high short circuit current will be conducted by its conductors b+ and b−, generating a supressing induction field in each of the chokes 3b and 3c.

Thus, in some embodiments of the present invention, each of the magnetic coupling devices 3a-d is arranged between the two current paths of the two semiconductor devices Sa-d such that the positive conductor a-d+ of one of the two current paths and the negative conductor a-d− of the other of the two current paths pass via the magnetic coupling device.

Figure 2B:
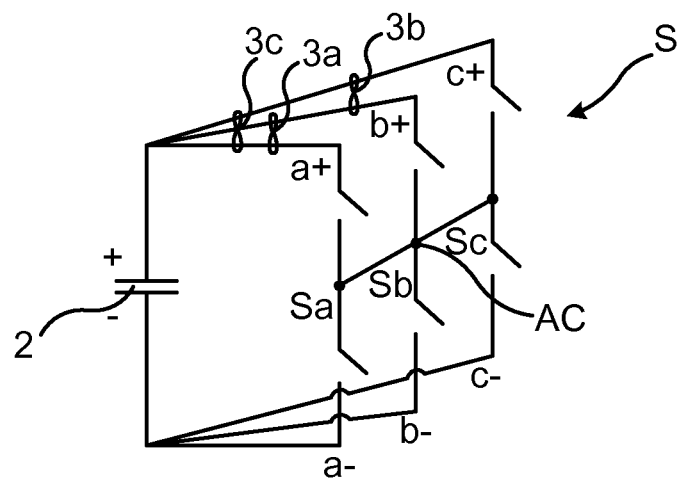
FIG. 2b is a schematic circuit diagram of another embodiment of a semiconductor switch leg comprising a plurality of semiconductor devices connected in parallel, in accordance with the present invention.

FIG. 2b illustrates another embodiment of a semiconductor switch leg S connected to an energy storing device 2 in a converter 1. If applicable, the discussion relating to FIG. 2a is also relevant to FIG. 2b. However, in the embodiment of FIG. 2b, the magnetic chokes 3a-c are arranged between the neighbouring semiconductor devices Sa-c such that only the positive conductors a-c+ are passing through the magnetic chokes. Additionally or alternatively, the magnetic chokes 3a-c are arranged between the neighbouring semiconductor devices Sa-c such that only the negative conductors a-c+ are passing through the magnetic chokes. In this case, each positive or negative conductor, respectively, may pass through two of the magnetic chokes in order to still form a daisy-chain topology. The figure shows an example embodiment with three semiconductor devices Sa-c and with only the positive conductors a-c+ passing through the corresponding three magnetic chokes 3a-c. Since only conductors of the same polarity (positive or negative), in this case positive polarity, pass through each choke 3, the conductors pass through the choke in opposite directions (could be called opposite magnetic directions) in order for the magnetic fields formed in the choke by the two positive conductors to substantially cancel each other out, similarly as the positive and negative conductors passing through the same choke do in the example of FIG. 2a when the conductors pass through the choke in the same (magnetic) direction but having different polarities. This is in FIG. 2b symbolically illustrated by the chokes being twisted.

Thus, in some embodiments of the present invention, each of the magnetic coupling devices 3a-d is arranged between the two current paths of the two semiconductor devices Sa-d such that the positive conductor a-d+ of one of the two current paths and the positive conductor of the other of the two current paths pass via the magnetic coupling device, or such that the negative conductor a-d− of one of the two current paths and the negative conductor of the other of the two current paths pass via the magnetic coupling device.

In some alternative embodiments (not shown in the figures), each of the magnetic coupling devices 3a-d is arranged between the two current paths of the two semiconductor devices Sa-d such that a conductor between two switches Su and Sl comprised in one of the two semiconductor devices and a conductor between two switches Su and Sl comprised in the other of the two semiconductor devices pass via the magnetic coupling device. It is noted that each of the semiconductor devices may in some embodiments comprise further switches in addition to the upper an lower switches Su and Sl.

In some embodiments, the invention may include a hybrid of any of the configurations of FIGS. 2a and 2b and the alternative embodiments, which is easily understood by a person skilled in the art.

Figure 3:
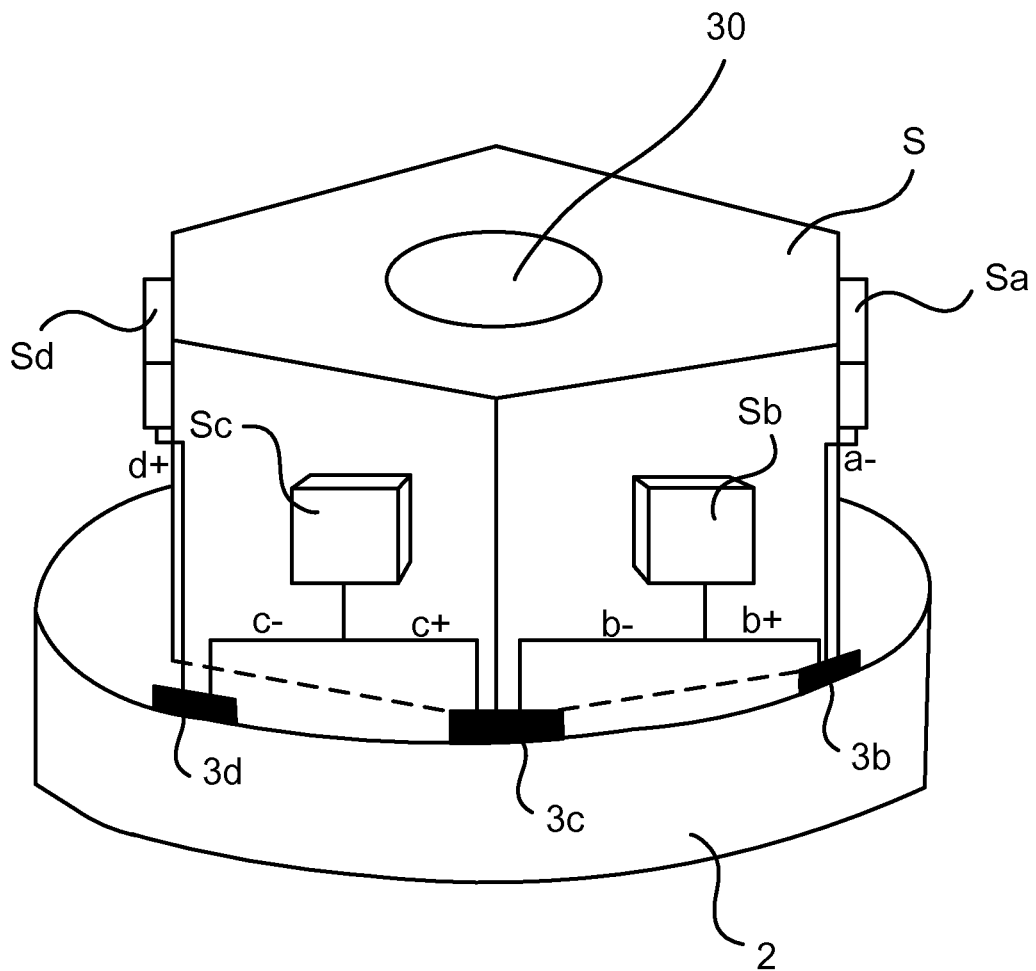
FIG. 3 is a schematic perspective view of an embodiment of a semiconductor switch leg comprising a plurality of semiconductor devices connected in parallel and to a ring shaped capacitor.

FIG. 3 illustrates an embodiment of a semiconductor switch leg S comprising six semiconductor devices (of which four, Sa-Sd, are shown), mounted on each side of a hexagonal cylinder on top of a ring-shaped capacitor 2. The hexagonal cylinder may be hollow, allowing cooling fluid, e.g. air, to pass through a cooling channel 30 through the hollow cylinder and the ring-shaped capacitor for cooling the semiconductor switch and the capacitor.

Embodiments of the present invention may be especially useful for medium- or high-voltage applications, e.g. using SiC as semiconductor material in the semiconductor devices. In some embodiments, the semiconductor switch leg S has a voltage rating of at least 3 kV, but SiC devices may also be used for significantly higher ratings such as at least 8 kV, e.g. at least 10 kV, at least 15 kV or at least 20 kV. Additionally or alternatively, in some embodiments, the semiconductor switch leg S has a power rating of at least 3200 MW, e.g. at least 3500 MW, at least 4000 MW or at least 4500 MW.

Embodiments of the present invention may be used for any type of semiconductor switches, e.g. based on Si, SiC or GaN, or other semiconducting material. For instance, each of the semiconductor devices Sa-d may comprise an IGBT, an RC-IGBT, a BIGT, an IGCT, a GTO, and/or a MOSFET.

Embodiments of the present invention may be used in any type of PE converter comprising semiconductor switches, e.g. 3-level converters and cascaded chain-link converters. In some embodiments, the converter 1 is a full- or half-bridge MMC.

The converter may be for any type of PE application, e.g. FACTS or HVDC, or motor drive, UPS or solar inverter.

The magnetic coupling devices, e.g. chokes, may be loop-shaped, e.g. annular or elliptical or any other shape in which the choke forms a loop defining a hole/opening through which the positive and negative conductors can be positioned. The magnetic chokes may e.g. be ferrite chokes, iron chocks, or any other positive magnetic permeability material. Alternatively, the magnetic coupling devices may be in the form of inductors, with each of the two current paths being wound on the same magnetic core, e.g. ferrite core.

The energy storing device 2 may be a capacitor arrangement, e.g. comprising a ring-shaped capacitor on which the parallel connected semiconductor devices Sa-d may be arranged in a loop which is herein called a daisy chain loop.

The electrical inductance in each magnetic choke may be low during regular operation of the semiconductor switch leg S. Typically, the inductance is zero or close to zero, or low e.g. within the range of 30-200 nH. In the event of a short circuit current passing through the magnetic choke, the inductance rises, e.g. to at least 1 µH such as to at least 5 or 10 µH, supressing the short circuit current, reducing the short circuit current and/or (especially) the rate with which the current increases due to the short circuit (i.e. di/dt) in the positive and/or negative conductor(s) of the short circuited semiconductor device.

The present disclosure has mainly been described above with reference to a few embodiments. However, as is readily appreciated by a person skilled in the art, other embodiments than the ones disclosed above are equally possible within the scope of the present disclosure, as defined by the appended claims.

The invention claimed is:

1. A semiconductor switch leg for a Power Electronic (PE) converter, the semiconductor switch leg comprising:
    a plurality of semiconductor devices that are connected with each other in parallel;
    a positive conductor connecting each semiconductor device of the plurality of semiconductor devices to a positive terminal of an energy storing device of the PE converter;
    a negative conductor connecting each semiconductor device of the plurality of semiconductor devices to a negative terminal of the energy storing device of the PE converter,
    wherein each semiconductor device of the plurality of semiconductor devices together with the positive conductor and the negative conductor forms a current path across the energy storing device, a plurality of magnetic coupling devices, each magnetic coupling device of the plurality of magnetic coupling devices being arranged between the two current paths of a respective two neighboring semiconductor devices of the plurality of semiconductor devices such that the current path of one of the respective two neighboring semiconductor devices and the current path of the other of the respective two neighboring semiconductor devices pass via the magnetic coupling device in opposite directions, and such that each current path of the plurality of semiconductor devices passes via two magnetic coupling devices of the plurality of magnetic coupling devices, wherein the current paths of the plurality of semiconductor devices via the plurality of magnetic coupling devices are parallel with each other; and wherein each of the magnetic coupling devices of the plurality of magnetic coupling devices is arranged between the two current paths of the respective two neighboring semiconductor devices such that the positive conductor of one of the two current paths and the negative conductor of the other of the two current paths pass via the magnetic coupling device.

2. The semiconductor switch leg of claim 1, wherein each of the plurality of semiconductor devices comprises silicon carbide, SiC.

3. The semiconductor switch leg of claim 2, each semiconductor device of the plurality of semiconductor devices comprises an Insulated-Gate Bipolar Transistor, IGBT; a Reverse Conducting IGBT, RC-IGBT; a Bi-Mode Insulated Gate Transistor, BIGT; an Integrated Gate-Commutated Thyristor, IGCT; a Gate Turn-Off Thyristor, GTO; or a Metal-Oxide-Semiconductor Field-Effect Transistor, MOSFET.

4. The semiconductor switch leg of claim 2, wherein the semiconductor switch leg is incorporated into a Modular Multilevel Converter, MMC.

5. The semiconductor switch leg of claim 2, wherein the semiconductor switch leg is incorporated into a converter for Flexible Alternating Current Transmission Systems, FACTS, or High-Voltage Direct Current, HVDC, or medium voltage drive, application.

6. The semiconductor switch leg of claim 2, wherein at least one magnetic coupling device of the plurality of magnetic coupling devices is loop-shaped, wherein the two current paths of the respective two neighboring semiconductor devices of at least one magnetic coupling device pass through an opening of the at least one magnetic coupling device.

7. The semiconductor switch leg of claim 1, wherein each of the plurality of semiconductor devices comprises an Insulated-Gate Bipolar Transistor, IGBT; a Reverse Conducting IGBT, RC-IGBT; a Bi-Mode Insulated Gate Transistor, BIGT; an Integrated Gate-Commutated Thyristor, IGCT; a Gate Turn-Off Thyristor, GTO; or a Metal-Oxide-Semiconductor Field-Effect Transistor, MOSFET.

8. The semiconductor switch leg of claim 7, wherein the semiconductor switch leg is incorporated into a Modular Multilevel Converter, MMC.

9. The semiconductor switch leg of claim 7, wherein the semiconductor switch leg is incorporated into a converter for Flexible Alternating Current Transmission Systems, FACTS, or High-Voltage Direct Current, HVDC, or medium voltage drive, application.

10. The semiconductor switch leg of claim 7, wherein at least one magnetic coupling device of the plurality of magnetic coupling devices is loop-shaped, wherein the two current paths of the respective two neighboring semiconductor devices of the at least one magnetic coupling device pass through an opening of the at least one magnetic coupling device.

11. The semiconductor switch leg of claim 1, wherein the semiconductor switch leg is incorporated into a Modular Multilevel Converter, MMC.

12. The semiconductor switch leg of claim 11, wherein the semiconductor switch leg is incorporated into a converter for Flexible Alternating Current Transmission Systems, FACTS, or High-Voltage Direct Current, HVDC, or medium voltage drive, application.

13. The semiconductor switch leg of claim 11, wherein at least one magnetic coupling device of the plurality of magnetic coupling devices is loop-shaped, wherein the two current paths of the respective two neighboring semiconductor devices of the at least one magnetic coupling device pass through an opening of the at least one magnetic coupling device.

14. The semiconductor switch leg of claim 1, wherein the semiconductor switch leg is incorporated into a converter for Flexible Alternating Current Transmission Systems, FACTS, or High-Voltage Direct Current, HVDC, or medium voltage drive, application.

15. The semiconductor switch leg of claim 1, wherein at least one magnetic coupling device of the plurality of magnetic coupling devices is loop-shaped, wherein the two current paths of the respective two neighboring semiconductor devices of the at least one magnetic coupling device pass through an opening of the at least one magnetic coupling device.

16. The semiconductor switch leg of claim 1, wherein the energy storing device comprises a capacitor arrangement comprising a ring-shaped capacitor.

17. The semiconductor switch leg of claim 1, wherein the plurality of semiconductor devices is arranged in a daisy-chain loop.

18. A Power Electronic converter comprising:
a plurality of the semiconductor switch legs, wherein plurality of semiconductor switch legs comprises:
a plurality of semiconductor devices that are connected with each other in parallel;
a positive conductor connecting each semiconductor device of the plurality of semiconductor devices to a positive terminal of an energy storing device of the PE converter;
a negative conductor connecting each semiconductor device of the plurality of semiconductor devices to a negative terminal of the energy storing device of the PE converter,
wherein each semiconductor device of the plurality of semiconductor devices together with the positive conductor and the negative conductor forms a current path across the energy storing device,
a plurality of magnetic coupling devices, each magnetic coupling device of the plurality of magnetic coupling devices being arranged between the two current paths of a respective two neighboring semiconductor devices of the plurality of semiconductor devices such that the current path of one of the respective two neighboring semiconductor devices and the current path of the other of the respective two neighboring semiconductor devices pass via the magnetic coupling device in opposite directions, and such that each current path of the plurality of semiconductor devices passes via two magnetic coupling devices of the plurality of magnetic coupling devices, wherein the current paths of the plurality of semiconductor devices via the plurality of magnetic coupling devices are parallel with each other; and wherein magnetic coupling devices of the plurality of magnetic coupling devices is arranged between the two current paths of the respective two neighboring semiconductor devices such that the positive conductor of one of the two current paths and the negative conductor of the other of the two current paths pass via the magnetic coupling device.

19. A method of protecting a semiconductor switch leg of a Power Electronic (PE), (PE) converter during short circuit, the method comprising:

having a semiconductor switch leg, the semiconductor switch leg comprising:
a plurality of semiconductor devices that are connected with each other in parallel;
a positive conductor connecting each semiconductor device of the plurality of semiconductor devices to a positive terminal of an energy storing device of the PE converter;
a negative conductor connecting each semiconductor device of the plurality of semiconductor devices to a negative terminal of the energy storing device of the PE converter,
wherein each semiconductor device of the plurality of semiconductor devices together with the positive conductor and the negative conductor forms a current path across the energy storing device,
a plurality of magnetic coupling devices, each magnetic coupling device of the plurality of magnetic coupling devices being arranged between the two current paths of a respective two neighboring semiconductor devices of the plurality of parallel connected semiconductor devices such that the current path of one of the respective two neighboring semiconductor devices and the current path of the other of the respective two neighboring semiconductor devices pass via the magnetic coupling device in opposite directions, and such that each current path of the plurality of semiconductor devices passes via two magnetic coupling devices of the plurality of magnetic coupling devices, wherein the current paths of the plurality of semiconductor devices via the plurality of magnetic coupling devices are parallel with each other, and wherein magnetic coupling devices of the plurality of magnetic coupling devices is arranged between the two current paths of the respective two neighboring semiconductor devices such that the positive conductor of one of the two current paths and the negative conductor of the other of the two current paths pass via the magnetic coupling device; and generating an inductance in at least one of the magnetic coupling devices of the plurality of magnetic coupling devices in response to a short circuit current being conducted through one of the two current paths of the respective two neighboring semiconductor devices passing via the at least one of the devices of the plurality of magnetic coupling devices, the inductance suppressing the short circuit current.

20. The method of claim 19, wherein the inductance is at least 1 μH.

* * * * *